(12) United States Patent
Zhang et al.

(10) Patent No.: US 10,573,555 B2
(45) Date of Patent: Feb. 25, 2020

(54) METHODS OF PRODUCING SELF-ALIGNED GROWN VIA

(71) Applicant: Micromaterials LLC, Wilmington, DE (US)

(72) Inventors: Ying Zhang, Santa Clara, CA (US); Regina Freed, Los Altos, CA (US); Nitin K. Ingle, Santa Clara, CA (US); Ho-yung Hwang, Cupertino, CA (US); Uday Mitra, Cupertino, CA (US); Abhijit Basu Mallick, Palo Alto, CA (US)

(73) Assignee: Micromaterials LLC, Wilmington, DE (US)

( * ) Notice: Subject to any disclaimer, the term of this patent is extended or adjusted under 35 U.S.C. 154(b) by 0 days.

(21) Appl. No.: 16/116,421

(22) Filed: Aug. 29, 2018

(65) Prior Publication Data

US 2019/0067103 A1 Feb. 28, 2019

Related U.S. Application Data

(60) Provisional application No. 62/552,793, filed on Aug. 31, 2017.

(51) Int. Cl.
*H01L 21/768* (2006.01)
*H01L 21/311* (2006.01)
(Continued)

(52) U.S. Cl.
CPC .. *H01L 21/76897* (2013.01); *H01J 37/32715* (2013.01); *H01L 21/02244* (2013.01);
(Continued)

(58) Field of Classification Search
CPC ........... H01L 21/76843; H01L 21/7682; H01L 21/76897; H01L 21/76801;
(Continued)

(56) References Cited

U.S. PATENT DOCUMENTS

| 4,671,970 A | 6/1987 | Keiser et al. |
| 5,824,597 A | 10/1998 | Hong |

(Continued)

FOREIGN PATENT DOCUMENTS

| JP | 2008108757 A | 5/2008 |
| JP | 2011060803 A | 3/2011 |

(Continued)

OTHER PUBLICATIONS

PCT International Search Report and Written Opinion in PCT/US2018/048509 dated Dec. 13, 2018, 10 pages.

(Continued)

*Primary Examiner* — Brian Turner
(74) *Attorney, Agent, or Firm* — Servilla Whitney LLC

(57) ABSTRACT

Methods and apparatus to form fully self-aligned vias are described. Portions of first conductive lines are recessed in a first insulating layer on a substrate. A first metal film is formed in the recessed portions of the first conductive lines and pillars are formed from the first metal film. A second insulating layer is deposited around the pillars. The pillars are removed to form vias in the second insulating layer. A third insulating layer is deposited in the vias and an overburden is formed on the second insulating layer. Portions of the overburden are selectively etched from the second insulating layer to expose the second insulating layer and the filled vias and leaving portions of the third insulating layer on the second insulating layer. The third insulating layer is etched from the filled vias to form a via opening to the first conductive line.

16 Claims, 9 Drawing Sheets

(51) Int. Cl.
*H01J 37/32* (2006.01)
*H01L 23/532* (2006.01)
*H01L 21/02* (2006.01)
*H01L 21/3105* (2006.01)
*H01L 23/522* (2006.01)

(52) U.S. Cl.
CPC .. *H01L 21/31055* (2013.01); *H01L 21/31116* (2013.01); *H01L 21/76808* (2013.01); *H01L 21/76819* (2013.01); *H01L 21/76831* (2013.01); *H01L 21/76843* (2013.01); *H01L 21/76888* (2013.01); *H01L 23/5226* (2013.01); *H01J 2237/332* (2013.01); *H01J 2237/334* (2013.01); *H01L 21/31111* (2013.01); *H01L 21/76834* (2013.01); *H01L 21/76849* (2013.01); *H01L 21/76883* (2013.01); *H01L 23/53209* (2013.01); *H01L 23/53223* (2013.01); *H01L 23/53238* (2013.01); *H01L 23/53252* (2013.01); *H01L 23/53266* (2013.01); *H01L 2221/1026* (2013.01)

(58) Field of Classification Search
CPC ......... H01L 21/31122; H01L 21/76888; H01L 21/76879; H01L 21/76871; H01L 21/76849; H01L 21/76834; H01L 23/53266; H01L 21/76883; H01L 21/76807; H01J 37/32715; H01J 37/32357
See application file for complete search history.

(56) References Cited

U.S. PATENT DOCUMENTS

| | | | |
|---|---|---|---|
| 6,130,151 A | 10/2000 | Lin et al. | |
| 6,143,653 A | 11/2000 | Tsai et al. | |
| 6,528,884 B1 | 3/2003 | Lopatin et al. | |
| 6,576,113 B1 | 6/2003 | Scherer et al. | |
| 6,653,200 B2 | 11/2003 | Olsen | |
| 7,192,803 B1 | 3/2007 | Lin et al. | |
| 7,279,119 B2 | 10/2007 | Hellring et al. | |
| 7,288,463 B1 | 10/2007 | Papasouliotis | |
| 7,541,297 B2 | 6/2009 | Mallick et al. | |
| 7,985,977 B2 | 7/2011 | Gogoi et al. | |
| 8,034,705 B2 | 10/2011 | Choi et al. | |
| 8,338,225 B2 | 12/2012 | Breitwisch et al. | |
| 8,575,753 B2 | 11/2013 | Choi et al. | |
| 8,951,429 B1 | 2/2015 | Liu et al. | |
| 9,012,322 B2 | 4/2015 | Duong et al. | |
| 9,117,884 B1 | 8/2015 | Shaviv et al. | |
| 9,236,292 B2 | 1/2016 | Romero et al. | |
| 9,312,220 B2 | 4/2016 | Lu et al. | |
| 9,324,650 B2 | 4/2016 | Edelstein et al. | |
| 9,362,165 B1 | 6/2016 | Bouche et al. | |
| 9,362,413 B2 | 6/2016 | Yu et al. | |
| 9,368,395 B1 | 6/2016 | Wei et al. | |
| 9,490,202 B2 | 11/2016 | Lin et al. | |
| 9,666,451 B2 | 5/2017 | Wallace et al. | |
| 9,679,781 B2 | 6/2017 | Abatchez et al. | |
| 9,721,888 B2 | 8/2017 | Chang et al. | |
| 9,837,314 B2 | 12/2017 | Smith et al. | |
| 10,083,834 B2 | 9/2018 | Thompson et al. | |
| 10,319,604 B2 | 6/2019 | Duan et al. | |
| 10,319,636 B2 | 6/2019 | Basu et al. | |
| 2002/0098642 A1 | 7/2002 | Harris et al. | |
| 2002/0163081 A1 | 11/2002 | Aoyama | |
| 2003/0143862 A1 | 7/2003 | Iyer | |
| 2004/0067649 A1 | 4/2004 | Hellring et al. | |
| 2004/0192034 A1 | 9/2004 | Ohiwa et al. | |
| 2005/0121768 A1 | 6/2005 | Edelstein et al. | |
| 2005/0167846 A1 | 8/2005 | Aoyama | |
| 2005/0266627 A1 | 12/2005 | Furukawa et al. | |
| 2006/0169576 A1 | 8/2006 | Brown et al. | |
| 2006/0286806 A1 | 12/2006 | Ohkuni et al. | |
| 2007/0166981 A1 | 7/2007 | Furukawa et al. | |
| 2007/0199922 A1 | 8/2007 | Shen et al. | |
| 2008/0160783 A1 | 7/2008 | Watanabe et al. | |
| 2008/0182411 A1 | 7/2008 | Elers | |
| 2008/0242097 A1 | 10/2008 | Boescke et al. | |
| 2009/0017631 A1 | 1/2009 | Bencher | |
| 2009/0072409 A1 | 3/2009 | Nitta et al. | |
| 2009/0174040 A1 | 7/2009 | Gogoi et al. | |
| 2009/0269569 A1 | 10/2009 | Fucsko et al. | |
| 2010/0078617 A1 | 4/2010 | Breitwisch et al. | |
| 2010/0096691 A1 | 4/2010 | Shin et al. | |
| 2010/0171220 A1 | 7/2010 | Cheng-Lin | |
| 2010/0173494 A1 | 7/2010 | Kobrin | |
| 2010/0203725 A1 | 8/2010 | Choi et al. | |
| 2010/0301480 A1 | 12/2010 | Choi et al. | |
| 2010/0330805 A1 | 12/2010 | Doan et al. | |
| 2011/0049568 A1 | 3/2011 | Lochtefeld et al. | |
| 2011/0057317 A1 | 3/2011 | Koike et al. | |
| 2011/0089393 A1 | 4/2011 | Kuo-Pin et al. | |
| 2011/0207318 A1 | 8/2011 | Usami | |
| 2011/0281417 A1 | 11/2011 | Gordon et al. | |
| 2012/0115302 A1 | 5/2012 | Breitwisch et al. | |
| 2012/0156857 A1 | 6/2012 | Cohen | |
| 2012/0178235 A1 | 7/2012 | Pachamuthu et al. | |
| 2013/0072019 A1 | 3/2013 | Ryan | |
| 2013/0109148 A1 | 5/2013 | Oh et al. | |
| 2013/0241037 A1 | 9/2013 | Jeong et al. | |
| 2013/0264533 A1 | 10/2013 | Cheong et al. | |
| 2014/0029181 A1 | 1/2014 | Gstrein | |
| 2014/0264747 A1 | 9/2014 | Barabash | |
| 2014/0264896 A1 | 9/2014 | Wei et al. | |
| 2014/0327140 A1 | 11/2014 | Zhang et al. | |
| 2015/0111374 A1 | 4/2015 | Bao et al. | |
| 2015/0132901 A1 | 5/2015 | Wang et al. | |
| 2015/0137113 A1 | 5/2015 | Yu et al. | |
| 2015/0170956 A1 | 6/2015 | Naik et al. | |
| 2015/0279736 A1 | 10/2015 | Hotta et al. | |
| 2015/0287675 A1 | 10/2015 | Shaviv | |
| 2015/0325622 A1 | 11/2015 | Zhang et al. | |
| 2015/0357439 A1 | 12/2015 | Liu et al. | |
| 2015/0364420 A1 | 12/2015 | Mei et al. | |
| 2015/0371896 A1 | 12/2015 | Chen et al. | |
| 2016/0049427 A1 | 2/2016 | Zang | |
| 2016/0056074 A1 | 2/2016 | Na | |
| 2016/0056104 A1 | 2/2016 | Bouche et al. | |
| 2016/0068710 A1 | 3/2016 | Wang et al. | |
| 2016/0093635 A1 | 3/2016 | Rabkin et al. | |
| 2016/0111342 A1 | 4/2016 | Huang et al. | |
| 2016/0141416 A1 | 5/2016 | Mariani et al. | |
| 2016/0155664 A1* | 6/2016 | Chan | H01L 21/76877 438/643 |
| 2016/0163587 A1 | 6/2016 | Backes et al. | |
| 2016/0163640 A1 | 6/2016 | Edelstein et al. | |
| 2016/0190008 A1 | 6/2016 | Chandrashekar et al. | |
| 2016/0190009 A1 | 6/2016 | Wallace et al. | |
| 2016/0260779 A1 | 9/2016 | Kawashima et al. | |
| 2017/0076945 A1 | 3/2017 | Hudson | |
| 2017/0077037 A1 | 3/2017 | Kelly et al. | |
| 2017/0186849 A1 | 6/2017 | Chen et al. | |
| 2017/0263563 A1 | 9/2017 | Dutta et al. | |
| 2017/0338149 A1 | 11/2017 | Lin | |
| 2018/0096847 A1 | 4/2018 | Thompson et al. | |
| 2018/0130671 A1 | 5/2018 | Duan et al. | |
| 2018/0144980 A1 | 5/2018 | Basu et al. | |
| 2018/0358260 A1 | 12/2018 | Roy et al. | |
| 2019/0067103 A1 | 2/2019 | Zhang et al. | |

FOREIGN PATENT DOCUMENTS

| | | |
|---|---|---|
| JP | 2011233922 A | 11/2011 |
| KR | 100223334 B1 | 10/1999 |
| KR | 20000026588 A | 5/2000 |
| KR | 20020020969 A | 3/2002 |

(56) References Cited

FOREIGN PATENT DOCUMENTS

WO  2016/106092 A1  6/2016
WO  2017136577 A1  8/2017

OTHER PUBLICATIONS

PCT International Search Report and Written Opinion in PCT/US2017/037141 dated Aug. 31, 2017, 11 pages.
PCT International Search Report and Written Opinion in PCT/US2017/053936 dated Jan. 12, 2018, 10 pages.
PCT International Search Report and Written Opinion in PCT/US2017/059737 dated May 18, 2018, 11 pages.
PCT International Search Report and Written Opinion in PCT/US2017/060367 dated Feb. 22, 2018, 9 pages.
PCT International Search Report and Written Opinion in PCT/US2017/060368 dated Jan. 31, 2018, 11 pages.
PCT International Search Report and Written Opinion in PCT/US2018/019146 dated May 23, 2018, 12 pages.
PCT International Search Report and Written Opinion in PCT/US2018/027284 dated Aug. 2, 2018, 10 pages.
PCT international Search Report and Written Opinion in PCT/US2018/036690 dated Sep. 18, 2018, 9 pages.
PCT International Search Report and Written Opinion in PCT/US2018/048503 dated Dec. 14, 2018, 10 pages.
PCT International Search Report and Written Opinion in PCT/US2018/048504 dated Dec. 13, 2018, 10 pages.
PCT ISR & Written Opinion for PCT/US2018/026026, dated Jul. 26, 2018, 11 pages.

* cited by examiner

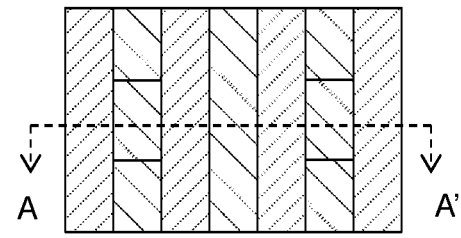
FIG. 4A  FIG. 4B
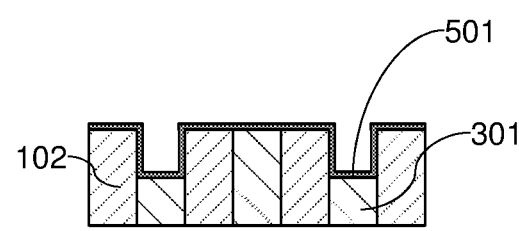
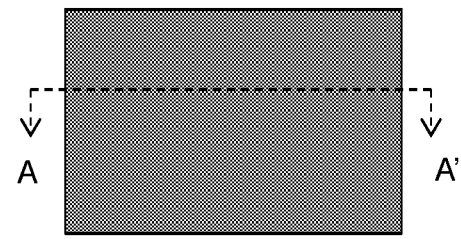
FIG. 5A  FIG. 5B
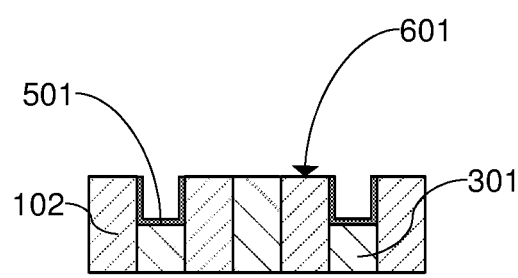
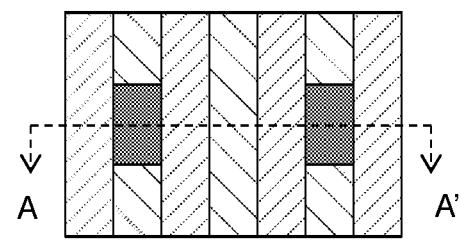
FIG. 6A  FIG. 6B

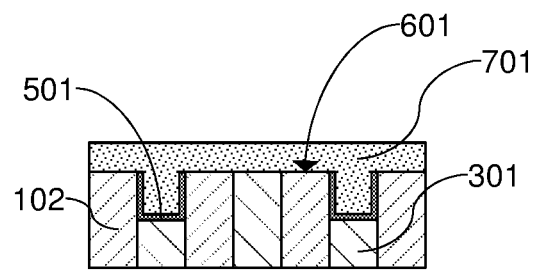 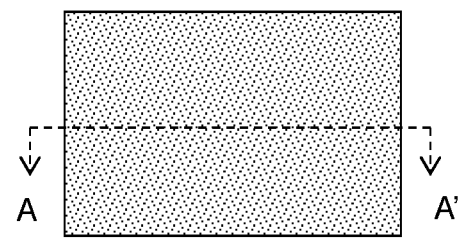
FIG. 7A  FIG. 7B
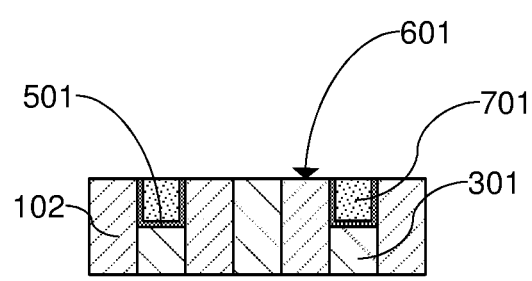 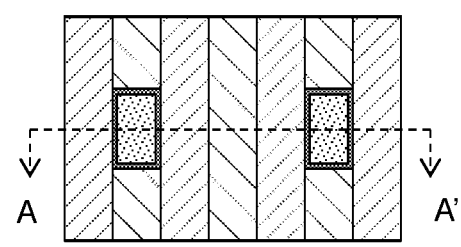
FIG. 8A  FIG. 8B
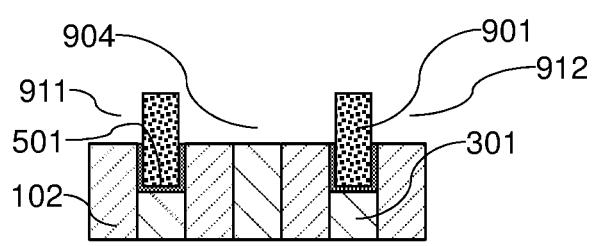 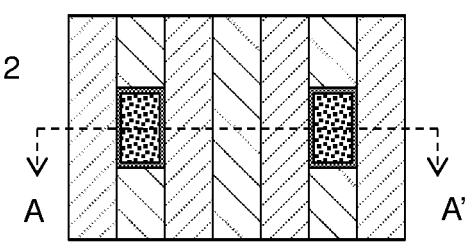
FIG. 9A  FIG. 9B

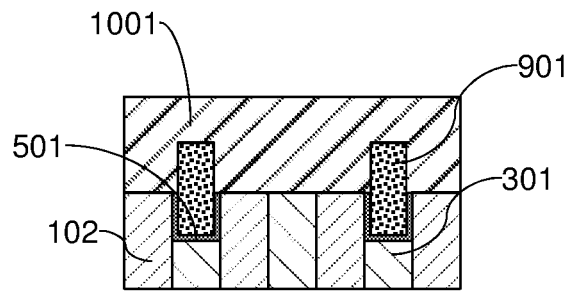 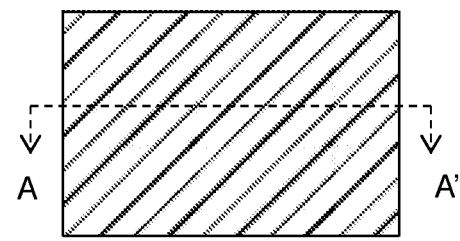
FIG. 10A  FIG. 10B
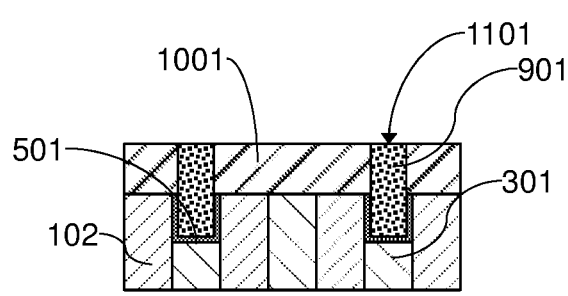 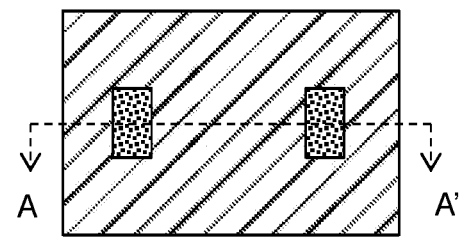
FIG. 11A  FIG. 11B
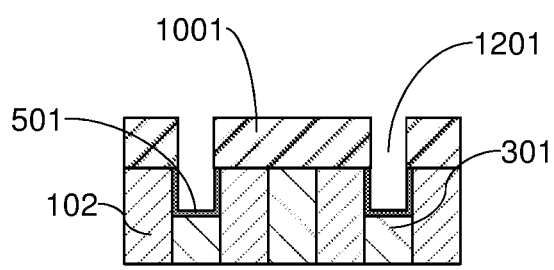 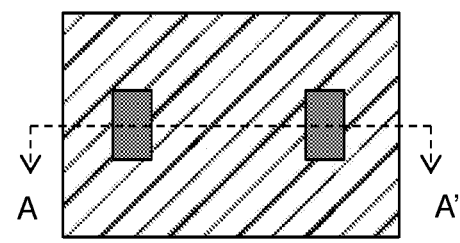
FIG. 12A  FIG. 12B

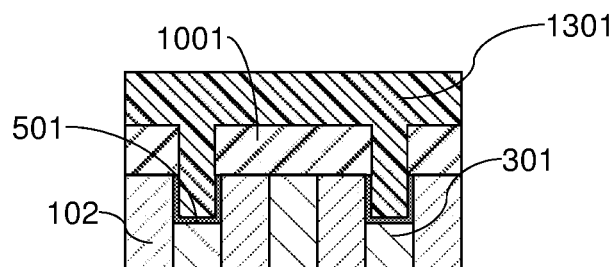 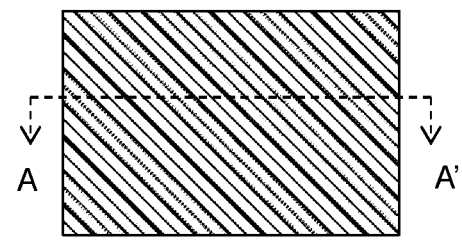
FIG. 13A  FIG. 13B
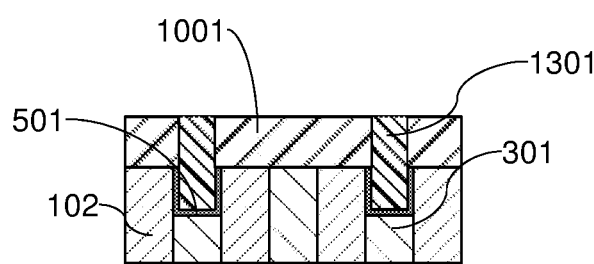 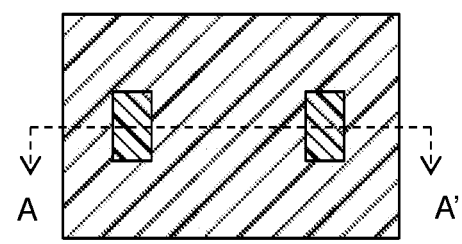
FIG. 14A  FIG. 14B
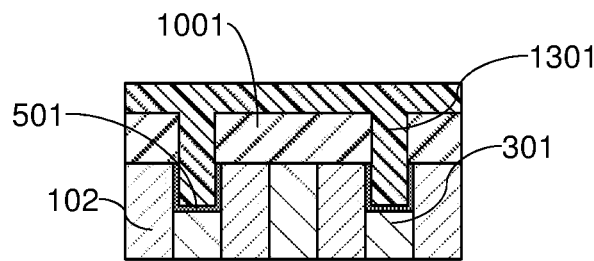 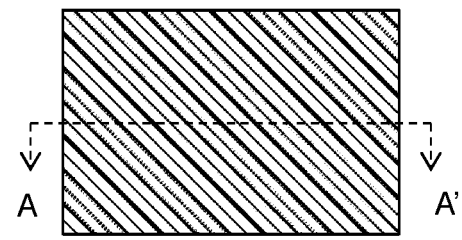
FIG. 15A  FIG. 15B

METHODS OF PRODUCING SELF-ALIGNED GROWN VIA

CROSS-REFERENCE TO RELATED APPLICATIONS

This application claims priority to U.S. Provisional Application No. 62/552,793, filed Aug. 31, 2017, the entire disclosure of which is hereby incorporated by reference herein.

FIELD

Embodiments of the disclosure generally relate to methods of integrated circuit manufacturing requiring the connecting of multiple layers through a via. More particularly, embodiments of the disclosure are directed to methods of producing vias which are self-aligned such that conductive layers with lines running in opposing directions are connected.

BACKGROUND

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of the interlayer dielectric material are placed between the metallization layers of the IC for insulation.

As the size of the integrated circuit decreases, the spacing between the metal lines decreases. Typically, to manufacture an interconnect structure, a planar process is used that involves aligning and connecting one layer of metallization to another layer of metallization.

Typically, patterning of the metal lines in the metallization layer is performed independently from the vias above that metallization layer. Conventional via manufacturing techniques, however, cannot provide full via self-alignment. In the conventional techniques, the vias formed to connect lines in an upper metallization layer to a lower metallization are often misaligned to the lines in the lower metallization layer. The via-line misalignment increases via resistance and leads to potential shorting to the wrong metal line. The via-line misalignment causes device failures, decreases yield and increases manufacturing cost. Therefore, a method of producing fully self-aligned vias is needed.

SUMMARY

One or more embodiments of the disclosure are directed to methods to provide a self-aligned via. Pillars are formed from a first metal film on recessed portions of first conductive lines extending along a first direction. The first conductive lines are between first insulating layers. A second insulating layer is deposited around the pillars. The pillars are removed to form vias in the second insulating layer. A third insulating layer is deposited in the vias onto the recessed portion of the first conductive lines to form filled vias. An overburden of third insulating layer is formed on the second insulating layer. A portion of the overburden is selectively etched from the second insulating layer to expose the second insulating layer and the filled vias and leaving portions of third insulating layer on the second insulating layer. The third insulating layer is etched from the filled vias to form a via opening to the first conductive line.

Additional embodiments of the disclosure are directed to systems to manufacture an electronic device. The systems include a processing chamber, a plasma source and a processor. The processing chamber comprises a pedestal to hold a substrate comprising a plurality of first conductive lines on a first insulating layer. The first conductive lines extend along a first direction on the first insulating layer. The plasma source is coupled to the processing chamber to generate plasma. The processor is coupled to the plasma source. The processor has one or more configurations to control actions selected from: recessing a portion of the first conductive lines, forming a first metal film on the recessed portion of the first conductive lines, forming pillars from the first metal film in the recessed portions of the first conductive lines, depositing a second insulating layer around the pillars, removing the pillars to form vias in the second insulating layer, depositing a third insulating layer through the vias onto the recessed portions of the first conductive lines to form filled vias, forming an overburden of third insulating layer on the second insulating layer, selectively etching a portion of the overburden from the second insulating layer to expose the second insulating layer and the filled vias and leaving portions of third insulating layer on the second insulating layer, and/or etching the third insulating layer from the filled vias to form a via opening to the first conductive line.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4A is a side cross-sectional view of the electronic device structure after a mask layer is removed according to some embodiments;

FIG. 4B is a top view of the electronic device structure of FIG. 4A;

FIG. 5A is a side cross-sectional view of the electronic device structure after a liner is deposited on the insulating layers and the recessed conductive lines according to some embodiments;

FIG. 5B is a top view of the electronic device structure of FIG. 5A;

FIG. 6A is a side cross-sectional view of the electronic device structure after portions of the liner are removed from the insulating layers according to some embodiments;

FIG. 6B is a top view of the electronic device structure of FIG. 6A;

FIG. 7A is a side cross-sectional view of the electronic device structure after a seed gapfill layer is deposited on the liner according to some embodiments;

FIG. 7B is a top view of the electronic device structure of FIG. 7A;

FIG. 8A is a side cross-sectional view of the electronic device structure after portions of the seed gapfill layer are removed according to some embodiments;

FIG. 8B is a top view of the electronic device structure shown in FIG. 8A;

FIG. 9A is a side cross-sectional view of the electronic device structure after self-aligned selective growth pillars are formed according to some embodiments;

FIG. 9B is a top view of the electronic device structure shown in FIG. 9A;

FIG. 10A is a side cross-sectional view of the electronic device structure after depositing the second insulating material according to some embodiments;

FIG. 10B is a top view of the electronic device structure shown in FIG. 10A;

FIG. 11A is a side cross-sectional view of the electronic device structure after excess second insulating material is removed to expose the top of the pillars according to some embodiments;

FIG. 11B is a top view of the electronic device structure shown in FIG. 11A;

FIG. 12A is a side cross-sectional view of the electronic device structure after the pillars have been removed according to some embodiments;

FIG. 12B is a top view of the electronic device structure shown in FIG. 12A;

FIG. 13A is a side cross-sectional view of the electronic device structure after depositing a third insulating layer according to some embodiments;

FIG. 13B is a top view of the electronic device structure shown in FIG. 13A;

FIG. 14A is a side cross-sectional view of the electronic device structure after removing an overburden of the third insulating layer according to some embodiments;

FIG. 14B is a top view of the electronic device structure shown in FIG. 14A;

FIG. 15A is a side cross-sectional view of the electronic device structure after depositing the third insulating layer to a predetermined depth according to some embodiments;

FIG. 15B is a top view of the electronic device structure shown in FIG. 15A;

DETAILED DESCRIPTION

Figure 1A:
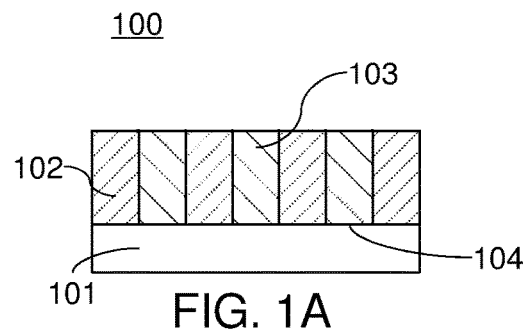
FIG. 1A illustrates a side cross-sectional view of an electronic device structure to provide a fully self-aligned via according to some embodiments.

Methods and apparatuses to provide fully self-aligned vias are described. In one embodiment, a first metallization layer comprising a set of first conductive lines extending along a first direction on a first insulating layer on a substrate is formed. A second insulating layer is formed on the first insulating layer. A second metallization layer comprising a set of second conductive lines on a third insulating layer above the first metallization layer is formed. The set of second conductive lines extend along a second direction. A via is formed between the first metallization layer and the second metallization layer. The via is self-aligned along the second direction to one of the first conductive lines. The via is self-aligned along the first direction to one of the second conductive lines, as described in further detail below. In one embodiment, the first and second directions cross each other at an angle. In one embodiment, the first direction and second direction are substantially orthogonal to each other.

In one embodiment, a fully self-aligned via is fabricated using a selective pillar growth technique. In one embodiment, portions of the conductive lines on a first insulating layer on a substrate are recessed. The conductive lines extend along a first direction on the first insulating layer. Pillars are formed on the recessed portions of the conductive lines. A second insulating layer is deposited between the pillars. The pillars are selectively removed to form vias. A third insulating layer is deposited on the second insulating layer to form filled vias. The third insulating layer is selectively etched relative to the second insulating layer form a via opening down to one of the conductive lines, as described in further detail below.

In one embodiment, a fully self-aligned via is the via that is self-aligned along at least two directions to the conductive lines in a lower and an upper metallization layers. In one embodiment, the fully self-aligned via is defined by a hard mask in one direction and the underlying insulating layer in another direction, as described in further detail below.

One or more embodiments provide fully self-aligned vias that advantageously eliminate the via misalignment issues and avoid shorting to the wrong metal line. The fully self-aligned vias provide lower via resistance and capacitance benefits over the conventional vias. Embodiments of the self-aligned vias provide full alignment between the vias and the conductive lines of the metallization layers that is substantially error free that advantageously increase the device yield and reduce the device cost.

In the following description, numerous details, such as materials, chemistries, dimensions of the elements, etc., are set forth in order to provide a thorough understanding of one or more of the embodiments of the present disclosure. One of ordinary skill in the art will understand that the one or more embodiments of the disclosure may be practiced without these details. In other instances, semiconductor fabrication processes, techniques, materials, equipment, etc., have not been described in details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present disclosure. Thus, the appearance of phrases like "in one embodiment" or "in an embodiment" in various places throughout the specification are not necessarily all referring to the same embodiment of the disclosure. Furthermore, the particular features, structures, or characteristics may be combined in any suitable manner in one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to methods and apparatus to provide fully self-aligned vias. The various aspects of the disclosure are described with respect to a detailed process illustrated in the Figures. Those skilled in the art will understand that the scope of the disclosure is not limited to the particular details described in the Figures and that some portions of the process can be altered or omitted.

A process for forming self-aligned vias is described with reference to FIGS. 1A through 21B. In each of FIGS. 1A through 21B, the Figure denoted 'A' shows a cross-sectional view and the Figure denoted 'B' shows a top view of a semiconductor device. The side view of the A Figures is taken along plane illustrated in the respective B Figures. For example, FIG. 1B illustrates a top view of a device structure and FIG. 1A shows a cross-sectional view of the device structure illustrated in FIG. 1B.

Figure 1B:
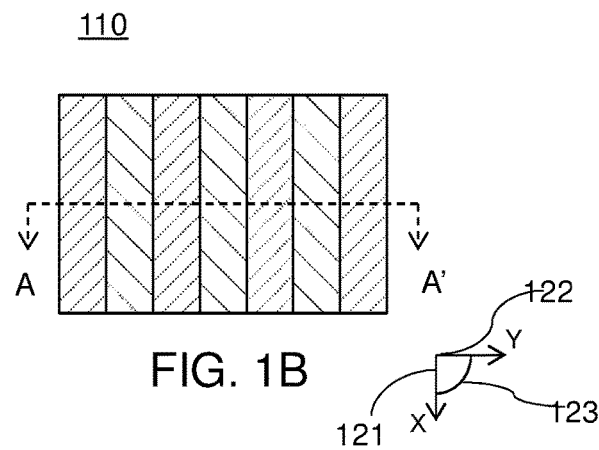
FIG. 1B is a top view of the electronic device structure depicted in FIG. 1A.

FIG. 1A illustrates a cross-sectional view 100 of an electronic device structure to provide a fully self-aligned via or air gap according to some embodiments. The cross-sectional view 100 is along an axis A-A', as depicted in FIG. 1B. FIG. 1B is a top view 110 of the electronic device structure depicted in FIG. 1A. A lower metallization layer (Mx) comprises a set of conductive lines that extend along an X axis (direction) 121 on a substrate 101, as shown in FIGS. 1A and 1B. As shown in FIG. 1B, X direction 121 crosses a Y axis (direction) 122 at an angle 123. In one or more embodiments, angle 123 is about 90 degrees. In some embodiments, angle 123 is an angle that is other than a 90 degrees angle. The insulating layer 102 comprises trenches 104 which are the gaps between adjacent insulating layers 102. The conductive lines 103 are deposited in trenches 104.

In some embodiments, the substrate 101 comprises a semiconductor material, e.g., silicon (Si), carbon (C), germanium (Ge), silicon germanium (SiGe), gallium arsenide (GaAs), InP, GaAs, InGaAs, InAlAs, other semiconductor material, or any combination thereof. In some embodiments, substrate 101 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 101 can be, for example, an organic, a ceramic, a glass, or a semiconductor substrate. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, substrate 101 includes one or more metallization interconnect layers for integrated circuits. In some embodiments, the substrate 101 includes interconnects, for example, vias, configured to connect the metallization layers. In some embodiments, the substrate 101 includes electronic devices, e.g., transistors, memories, capacitors, resistors, optoelectronic devices, switches, and any other active and passive electronic devices that are separated by an electrically insulating layer. For example, an interlayer dielectric, a trench insulation layer or any other insulating layer known to one of ordinary skill in the art of the electronic device manufacturing. In some embodiments, the substrate includes one or more buffer layers to accommodate for a lattice mismatch between the substrate 101 and one or more layers above substrate 101 and to confine lattice dislocations and defects.

Insulating layer 102 can be any material suitable to insulate adjacent devices and prevent leakage. In some embodiments, electrically insulating layer 102 is an oxide layer, e.g., silicon dioxide, or any other electrically insulating layer determined by an electronic device design. In some embodiments, insulating layer 102 comprises an interlayer dielectric (ILD). In some embodiments, insulating layer 102 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride or any combination thereof.

In some embodiments, insulating layer 102 includes a dielectric material having k value less than 5. In some embodiments, insulating layer 102 includes a dielectric material having k-value less than 2. In some embodiments, insulating layer 102 includes a nitride, oxide, a polymer, phosphosilicate glass, Fluorosilicate (SiOF) glass, organosilicate glass (SiOCH), other electrically insulating layer determined by an electronic device design, or any combination thereof. In some embodiments, insulating layer 102 may include polyimide, epoxy, photodefinable materials, such as benzocyclobutene (BCB), and WPR-series materials, or spin-on-glass.

In some embodiments, insulating layer 102 is a low-k interlayer dielectric to isolate one metal line from other metal lines on substrate 101. In some embodiments, the thickness of the layer 102 is in an approximate range from about 10 nanometers (nm) to about 2 microns (μm).

In some embodiments, insulating layer 102 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALO"), spin-on, or other insulating deposition techniques known to one of ordinary skill in the art of microelectronic device manufacturing.

In some embodiments, the lower metallization layer Mx comprising metal lines 103 is a part of a back end metallization of the electronic device. In some embodiments, the insulating layer 102 is patterned and etched using a hard mask to form trenches 104 using one or more patterning and etching techniques known to one of ordinary skill in the art of microelectronic device manufacturing. In some embodiments, the size of trenches in the insulating layer 102 is determined by the size of conductive lines formed later on in a process.

In some embodiments, forming the conductive lines 103 involves filling the trenches 104 with a layer of conductive material. In some embodiments, a base layer (not shown) is first deposited on the internal sidewalls and bottom of the trenches 104, and then the conductive layer is deposited on the base layer. In some embodiments, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the insulating layer 102. Additionally, the conductive barrier layer can be used to provide adhesion for the seed layer (e.g., copper).

In some embodiments, to form the base layer, the conductive barrier layer is deposited onto the sidewalls and bottom of the trenches 104, and then the seed layer is deposited on the conductive barrier layer. In another embodiment, the conductive base layer includes the seed layer that is directly deposited onto the sidewalls and bottom of the trenches 104. Each of the conductive barrier layer and seed layer may be deposited using any thin film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In some embodiments, the barrier layer may be a thin dielectric that has been etched to establish conductivity to the metal layer below. In some embodiments, the barrier layer may be omitted altogether and appropriate doping of the copper line may be used to make a "self-forming barrier".

In some embodiments, the conductive layer e.g., copper, is deposited onto the seed layer of base layer of copper, by an electroplating process. In some embodiments, the conductive layer is deposited into the trenches 104 using a damascene process known to one of ordinary skill in the art of microelectronic device manufacturing. In one embodiment, the conductive layer is deposited onto the seed layer in the trenches 104 using a selective deposition technique, such as but not limited to electroplating, electroless, a CVD, PVD, MBE, MOCVD, ALO, spin-on, or other deposition techniques known to one of ordinary skill in the art of microelectronic device manufacturing.

In some embodiments, the choice of a material for conductive layer for the conductive lines 103 determined the choice of a material for the seed layer. For example, if the material for the conductive lines 103 includes copper, the material for the seed layer also includes copper. In some embodiments, the conductive lines 103 include a metal, for example, copper (Cu), ruthenium (Ru), nickel (Ni), cobalt (Co), chromium (Cr), iron (Fe), manganese (Mn), titanium (Ti), aluminum (Al), hafnium (Hi), tantalum (Ta), tungsten (W), Vanadium (V), Molybdenum (Mo), palladium (Pd), gold (Au), silver (Au), platinum PI, indium (In), tin (Sn), lead (Pb), antimony (Sb), bismuth (Bi), zinc (Zn), cadmium (Cd), or any combination thereof.

In alternative embodiments, examples of the conductive materials that may be used for the conductive lines 103 of the metallization layer Mx are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In some embodiments, portions of the conductive layer and the base layer are removed to even out top portions of the conductive lines 103 with top portions of the insulating layer 102 using a chemical-mechanical polishing ("CMP") technique known to one of ordinary skill in the art of microelectronic device manufacturing.

In one non-limiting example, the thickness of the conductive lines 103 is in an approximate range from about 15 nm to about 1000 nm. In one non-limiting example, the thickness of the conductive lines 103 is from about 20 nm to about 200 nm. In one non-limiting example, the width of the conductive lines 103 is in an approximate range from about 5 nm to about 500 nm. In one non-limiting example, the spacing (pitch) between the conductive lines 103 is from about 2 nm to about 500 nm. In more specific non-limiting example, the spacing (pitch) between the conductive lines 103 is from about 5 nm to about 50 nm.

In some embodiments, the lower metallization layer Mx is configured to connect to other metallization layers (not shown). In some embodiments, the metallization layer Mx is configured to provide electrical contact to electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

Figure 2A:
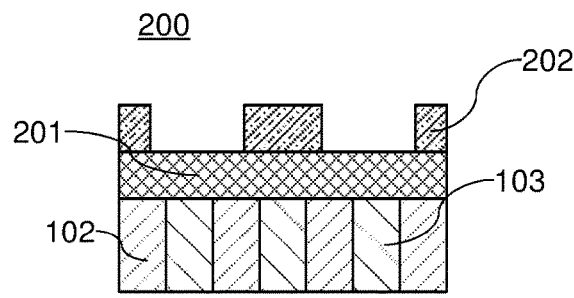
FIG. 2A is a side cross-sectional view of the electronic device structure after a mask layer is formed according to some embodiments.
Figure 2B:
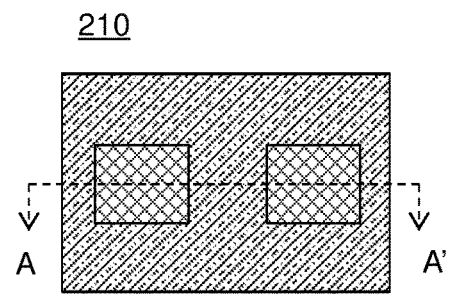
FIG. 2B is a top view of the electronic device structure of FIG. 2A.

FIG. 2A is a view 200 similar to view 100 of FIG. 1A. FIG. 2B is a view 210 similar to FIG. 1B. For simplicity, the substrate 101 is not shown in FIG. 2A or any subsequent drawing. FIG. 2A and FIG. 2B show the electronic device after a first mask 201 and a second mask 202 are deposited over a portion of the electronic device according to some embodiments. A first mask 201 and a second mask 202 are illustrated. Those skilled in the art will recognize that the masking and insulator layers can be single or multiple layers.

For clarity, in some embodiments, the first mask 201 is deposited over the entire electronic device (including the first conducting lines and the first insulating layers). The second mask 202 is deposited over nearly all of the electronic device, except for portions of the first conductive lines as shown in FIG. 2B. Mask 201 and/or mask 202 can be any suitable material. In some embodiments, one or more of mask 201 or mask 202 comprise silicon nitride, silicon oxide, silicon oxynitride, silicon carbide, silicon oxycarbide, silicon carbonitride or silicon oxycarbonitride. In some embodiments, one or more of the mask 201 or the mask 202 comprises a photoresist.

Figure 3A:
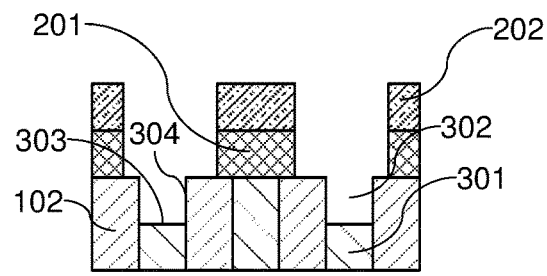
FIG. 3A is a side cross-sectional view of the electronic device structure after a portion of the conductive lines is removed according to some embodiments.
Figure 3B:
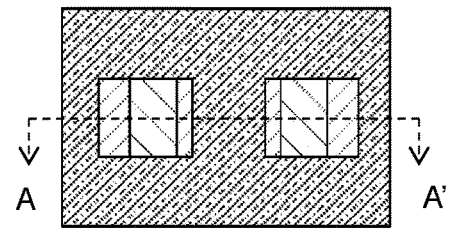
FIG. 3B is a top view of the electronic device structure of FIG. 3A.

FIGS. 3A and 3B are views similar to FIGS. 2A and 2B, respectively, after removing portions of the conductive lines 103 according to some embodiments. The conductive lines 103 and mask 201 can be removed by any suitable technique or combination of techniques. For example an etch process could selectively remove the conductive lines 103 and mask 201 without affecting insulating layer 102.

The conductive lines 103 are recessed to a predetermined depth to form recessed conductive lines 301. As shown in FIGS. 3A and 3B, trenches 302 are formed in the insulating layer 102. Each trench 302 has sidewalls 304 that are portions of insulating layer 102 and a bottom that is a top surface 303 of the recessed conductive line 301.

In some embodiments, the depth of the trenches 302 is from about 10 nm to about 500 nm. In some embodiments, the depth of the trenches 302 is from about 10% to about 100% of the thicknesses of the conductive lines. In some embodiments, the conductive lines 103 are recessed using one or more of wet etching, dry etching, or a combination of techniques known to one of ordinary skill in the art of electronic device manufacturing.

FIGS. 4A and 4B are views similar to FIGS. 3A and 3B, respectively, after removing portions of the mask 201 and mask 202 according to some embodiments. The mask 201 and mask 202 can be removed by any suitable technique or combination of techniques. For example an etch process could selectively remove mask 201 and mask 202 without affecting insulating layer 102 or conductive lines 103.

In some embodiments, the process from FIGS. 2A and 2B to FIGS. 4A and 4B may involve more than one etch process is used to remove portions of the conductive lines 103, mask 201 and mask 202. For example, a first etch process can be used to remove mask 201 and a second etch process can be used to remove mask 202 and portions of the conductive lines 103. In some embodiments, there are three etch processes used to remove the three layers with each etch process selective for one of the layers.

FIGS. 5A and 5B are views similar to FIGS. 4A and 4B, respectively, after a liner 501 is deposited on the electronic device.

FIGS. 6A and 6B are views similar to FIGS. 5A and 5B, respectively, after the liner 501 is removed from the top surface 601 of the electronic device, yet remains in the trenches 302. In some embodiments, the liner is removed using a chemical-mechanical polishing ("CMP") technique known to one of ordinary skill in the art of microelectronic device manufacturing.

In some embodiments, the liner 501 is selectively deposited on the bottom and sidewalls of the trenches 302, as shown in FIG. 6A, without depositing the liner 501 on the top surface of the electronic device. In some embodiments (not shown), the liner 501 is selectively deposited on the bottom 303 of the trenches 302, but not the sidewalls 304.

In some embodiments, liner 501 is deposited to protect the conductive lines 201 from changing the properties later on in a process (e.g., during tungsten deposition, or other processes). In some embodiments, liner 501 is a conductive liner. In another embodiment, liner 501 is a non-conductive liner. In some embodiments, when liner 501 is a non-conductive liner, the liner 301 is removed later on in a process, as described in further detail below. In some embodiments, liner 501 includes titanium nitride (TiN), titanium (Ti), tantalum (Ta), tantalum nitride (TaN), or any combination thereof. In another embodiment, liner 501 is an oxide, e.g., aluminum oxide (AlO), titanium oxide (TiO$_2$). In yet another embodiment, liner 501 is a nitride, e.g., silicon nitride (SiN). In an embodiment, the liner 301 is deposited to the thickness from about 0.5 nm to about 10 nm.

In some embodiments, the liner 301 is deposited using an atomic layer deposition (ALD) technique. In some embodiments, the liner 301 is deposited using one of deposition techniques, such as but not limited to a CVD, PVD, MBE, MOCVD, spin-on, or other liner deposition techniques known to one of ordinary skill in the art of microelectronic device manufacturing.

FIG. 7A and FIG. 7B are views similar to FIG. 6A and FIG. 6B, respectively, after a seed gapfill layer 701 is deposited on the liner 501 according to some embodiments. In some embodiments, seed gapfill layer 401 is a self-aligned selective growth seed film. As shown in FIG. 7A and FIG. 7B, seed gapfill layer 701 is deposited on liner 301 on the top surface 303 of the recessed conductive lines 301 and the sidewalls 304 of the trenches 302.

In some embodiments, seed gapfill layer 701 is a tungsten (W) layer, or other seed gapfill layer to provide selective growth pillars. In some embodiments, seed gapfill layer 701 is a metal film or a metal containing film. Suitable metal films include, but are not limited to, films including one or more of Co, Mo, W, Ta, Ti, Ru, rhodium (Rh), Cu, Fe, Mn, V, Niobium (Nb), hafnium (Hf), Zirconium (Zr), Yttrium (Y), Al, Sn, Cr, Lanthanum (La), or any combination thereof. In some embodiments, seed gapfill layer 701 comprises a tungsten (W) seed gapfill layer. Without limiting the composition of the seed gapfill layer, the seed gapfill layer may be referred to in this description and the appended claims as a metal layer.

In some embodiments, the seed gapfill layer 701 is deposited using one of deposition techniques, such as but not limited to an ALD, a CVD, PVD, MBE, MOCVD, spin-on, or other deposition techniques known to one of ordinary skill in the art of microelectronic device manufacturing.

FIG. 8A and FIG. 8B are views similar to FIG. 7A and FIG. 7B, respectively, after portions of the seed gapfill layer 701 are removed to expose top portions of the insulating layer 102 according to one embodiment. In some embodiments, portions the seed gapfill layer 701 are removed such that the seed gapfill layer 401 is coplanar with the top surface 601 of the electronic device. In some embodiments, the portions of the seed gapfill layer 701 are removed using one of the chemical-mechanical polishing (CMP) techniques known to one of ordinary skill in the art of microelectronic device manufacturing.

In some embodiments, the seed gapfill layer 701 is deposited within the trenches 302 without being deposited on the top surface 601 of the electronic device. In some embodiments, the trenches 302 are not completely filled by the seed gapfill layer 701.

FIGS. 9A and 9B are views similar to FIG. 8A and FIG. 8B, respectively, after self-aligned selective growth pillars 901 are formed using the seed gap fill layer 701 on the liner 501 on the recessed conductive lines 301 according to one or more embodiment. As shown in FIGS. 9A and 9B, an array of the self-aligned selective growth pillars 901 has the same pattern as a portion of the conductive lines 301. As shown in FIGS. 9A and 9B, the pillars 901 extend substantially orthogonally from the top surface 601 of the electronic device. As shown in FIGS. 9A and 9B, the pillars 901 are separated by gaps 904.

In some embodiments, the pillars 901 are selectively grown from the seed gapfill layer 701 on portions of the liner 501 on the conductive lines 103. In some embodiments, portions of the seed gapfill layer 701 above the conductive lines 103 are expanded for example, by oxidation, nitridation, or other process to grow pillars 901. In some embodiments, the seed gapfill layer 701 is oxidized by exposure to an oxidizing agent or oxidizing conditions to transform the metal or metal containing seed gapfill layer 701 to metal oxide pillars 901. Those skilled in the art will understand that forming the pillar is done by an electrochemical oxidation and does not necessarily contain oxygen. In some embodiments, pillars 901 include an oxide of one or more metals listed above. In more specific embodiment, pillars 901 include tungsten oxide (e.g., WO, $WO_3$ or other tungsten oxides). In some embodiments, the pillars 901 are a nitride.

The oxidizing agent can be any suitable oxidizing agent including, but not limited to, $O_2$, $O_3$, $N_2O$, $H_2O$, $H_2O_2$, CO, $CO_2$, $NH_3$, $N_2/Ar$, $N_2/He$, $N_2/Ar/He$ or any combination thereof. In some embodiments, the oxidizing conditions comprise a thermal oxidation, plasma enhanced oxidation, remote plasma oxidation, microwave and radio-frequency oxidation (e.g., inductively coupled plasma (ICP), capacitively coupled plasma (CCP)).

In some embodiments, the pillars 901 are formed by oxidation of the seed gapfill layer 701 at any suitable temperature depending on, for example, the composition of the seed gapfill layer and the oxidizing agent. In some embodiments, the oxidation occurs at a temperature in an approximate range of about 25 degrees C. to about 800 degrees C. In some embodiments, the oxidation occurs at a temperature greater than or equal to about 150° C. In some embodiments, the height of the pillars 901 is in an approximate range from about 5 angstroms (A.) to about 10 microns (μm).

FIGS. 10A and 10B are views similar to FIGS. 9A and 9B, respectively, after an insulating layer 1001 is deposited to overfill the gap 904 between the pillars 901 as well as the regions 911, 912 adjacent to the pillars 901 according to some embodiments. As shown in FIGS. 10A and 10B, insulating layer 1001 is deposited on the opposing sides 911, 912 of the pillars 901 and in the gap 904. The insulating layer 1001 may also be referred to as the second insulating layer and is comprised of a second insulating material. The second insulating layer 1001 can be any suitable dielectric material as described herein with regard to insulating layer 102.

In the embodiment shown in FIGS. 10A and 10B, the second insulating layer 1001 has a height greater than pillars 901. Stated differently, the thickness of the second insulating layer 1001 is sufficient to cover the pillars 901. In some embodiments, the second insulating layer 1001 is formed so that a top of the second insulating layer is substantially even with the pillars 901 or slightly below the top of pillars 901.

In some embodiments, insulating layer 1001 is a low-k gapfill layer. In some embodiments, insulating layer 1001 is flowable. In one embodiment, insulating layer 1001 is a flowable silicon oxide (FSiOx) layer. In some embodiments, insulating layer 1001 is an oxide layer, e.g., silicon dioxide, or any other electrically insulating layer determined by an electronic device design. In some embodiments, insulating layer 1001 is an interlayer dielectric (ILD). In some embodiments, insulating layer 1001 is a low-k dielectric that includes, but is not limited to, materials such as, e.g., silicon dioxide, silicon oxide, a carbon based material, e.g., a porous carbon film, carbon doped oxide ("CDO"), e.g., carbon doped silicon dioxide, porous silicon dioxide, porous silicon oxide carbide hydride (SiOCH), silicon nitride, or any combination thereof. In some embodiments, insulating layer 1001 is a dielectric material having k-value less than 3. In some embodiments, insulating layer 1001 is a dielectric material having k-value in an approximate range from about 2.2 to about 2.7. In some embodiments, insulating layer 1001 includes a dielectric material having k-value less than 2. In some embodiments, insulating layer 1001 represents one of the insulating layers described herein with respect to insulating layer 102.

In some embodiments, insulating layer 1001 is a low-k interlayer dielectric to isolate one metal line from other metal lines. In some embodiments, insulating layer 1001 is deposited using one of deposition techniques, such as but not limited to a CVD, spin-on, an ALD, PVD, MBE, MOCVD, or other low-k insulating layer deposition techniques known to one of ordinary skill in the art of microelectronic device manufacturing.

FIGS. 11A and 11B are views similar to FIGS. 10A and 10B, respectively, after chemical-mechanical planarization (CMP) of the insulating layer 1001 to expose the top 1101 of the pillars 901 according to some embodiments. As shown, the insulating layer 1001 is removed such that the pillars 901 are exposed while the insulating layer 1001 remains substantially coplanar with the top 1101 of the pillars 901. The CMP process can be any suitable planarization process known to those skilled in the art. In some embodiments, the insulating layer 1001 is deposited so that the top of the insulating layer 1001 is even with or slightly below the top 1101 of the pillars 901 and the CMP process is not performed.

FIGS. 12A and 12B are views similar to FIGS. 11A and 11B, respectively, after the pillars 901 are removed to form a gap 1201 via etch according to some embodiments. Etching of the pillars 901 can be done by any suitable technique. In some embodiments, etching the pillars 901 comprises exposing the pillars 901 to a metal halide compound. In some embodiments, the metal halide compound has a different metal than the pillars 901.

In some embodiments, etching the pillars 901 comprises exposure to a metal-and-halogen-containing precursor (e.g. $WCl_6$), also referred to as a metal halide precursor. The metal halide precursor can react with the pillars 901. In some embodiments, exposure to the metal halide precursor causes an exothermic reaction with the pillar material and no plasma is present in the substrate processing region. In some embodiments, there is no plasma used to excite the metal-halide precursor prior to entering the substrate processing region.

In an exemplary non-limiting process, the pillars 901 comprise tungsten and are grown by reaction with oxygen to form the tungsten oxide pillars, which may take the form of $WO_3$. Exposure of $WO_3$ to $WCl_6$ (or possibly $WCl_5$) forms volatile $WOCl_4$ and/or $WO_2Cl_2$ which leaves the surface until all tungsten oxide is removed. The reaction can spontaneously stop once the tungsten oxide portion (or metal oxide portion in general) is removed. The process can be repeated an integral number of cycles. Each cycle may remove a selectable amount of the original tungsten film (e.g. 1 or 2 monolayers).

In some embodiments, the metal halide precursor includes two or more or only two different elements including a metal element and a halogen element. The metal halide precursor may include only a single atom of the metal element but multiple atoms of the same halogen element (as is the case for $WCl_6$ and $WCl_5$). The metal element of the metal halide may include one or more of titanium, hafnium, zirconium, vanadium, niobium, tantalum, chromium, molybdenum, tungsten, manganese, rhenium, technetium, iron, aluminum and gallium in embodiments. In some embodiments, the metal element of the metal halide has an atomic number of 22, 23, 24, 40, 41, 42, 72, 73 or 74. In one or more embodiments, the metal element comprises an element of group 4, group 5 or group 6 of the periodic table or may be transition metals. The halogen element may be one of F and Cl according to one or more embodiments. The halogen element may be one or more of F, Cl, Br and/or I. In some embodiments, the metal-and-halogen-containing precursor is fluorine-free. Some examples of suitable metal halide precursors include, but are not limited to, vanadium pentahalides, tantalum pentahalides, chromium hexahalides, molybdenum pentahalides, molybdenum hexahalides, niobium pentahalides, tungsten pentahalides, tungsten hexahalides, and manganese tetrahalides. In some embodiments, the metal halide precursors include, but are not limited to, vanadium halides, tantalum halides, chromium halides, molybdenum halides, niobium halides, tungsten halides and/or manganese halides, where the oxidation state of the metal element can be any suitable oxidation state.

In the embodiment illustrated the liner 301 remains in the gap 1201. In some embodiments (not shown), the liner 301 is selectively removed using one or more of the dry and wet etching techniques known to one of ordinary skill in the art of electronic device manufacturing.

Etching can be performed in this part of the process, or any other part of the process incorporating an etch, by any suitable etch technique known to those skilled in the art. In some embodiments, the etch process is one or more of a dry etch or wet etch. In some embodiments, the etch solution comprises 5 wt % ammonium hydroxide aqueous solution at a temperature of about 80° C. In some embodiments, hydrogen peroxide is added to the ammonium hydroxide solution to increase the etch rate. In some embodiments, a hydrofluoric acid and nitric acid in a ratio of about 1:1 is used to etch. In some embodiments, the HF and $HNO_3$ in a ratio of about 3:7, respectively, is used to etch. In some embodiments, the $HF:HNO_3$ ratio is about 4:1. In some embodiments, the pillars 901 include tungsten and/or titanium and are etched using ammonium hydroxide:hydrogen peroxide in a ratio of 1:2. In one embodiment, the pillars 901 are selectively wet etched using 305 grams of potassium ferricyanide ($K_3Fe(CN)_6$), 44.5 grams of sodium hydroxide (NaOH) and 1000 ml of water ($H_2O$). In one embodiment, the pillars 901 are selectively wet etched using diluted or concentrated one or more of the chemistries including hydrochloric acid (HCl), $HNO_3$, sulfuric acid ($H_2SO_4$), HF, and $H_2O_2$. In one embodiment, the pillars 901 are selectively wet etched using HF, $HNO_3$ and acetic acid (HAc) in a ratio of 4:4:3, respectively. In one embodiment, the pillars 901 are selectively dry etched using a bromotrifluoromethane ($CBrF_3$) reactive ion etching (RIE) technique. In one embodiment the pillars 901 are selectively dry etched using a chlorine, fluorine, bromine or any combination thereof based chemistries. In one embodiment, the pillars 901 are selectively wet etched using hot or warm Aqua Regia mixture including HCl and $HNO_3$ in a ratio of 3:1, respectively. In one embodiment, the pillars 901 are selectively etched using alkali with oxidizers (potassium nitrate ($KNO_3$) and lead dioxide ($PbO_2$)).

FIGS. 13A and 13B are views similar to FIGS. 12A and 12B, respectively, after an insulating layer 1301 has been deposited on the insulating layer 1001 and in the gaps 1201 according to some embodiments. The insulating layer 1301 may be referred to as a third insulating layer and is comprised of a third insulating material. The third insulating layer 1301 can be any suitable dielectric that is different than the second insulating layer 1001 material as described herein with regard to insulating layer 102. The third insulating layer 1301 fills the gaps 1201 and contacts the liner 501 (as shown) or the recessed first conductive lines 301 (if no liner 501 is present).

FIG. 13A is a view 1300 and FIG. 13B is a view 1310 that are similar to FIGS. 12A and 12B, respectively, after gap-filling the vias 1201 with a third insulating layer 1301. The third insulating layer 1301 can be any suitable dielectric material that is different than the second insulating layer 1001. The third insulating layer 1301 fills the vias 1201 and contacts the liner 301 (as shown) or the recessed first conductive lines 201 (if no liner 301 is present).

FIGS. 15A and 15B are views similar to FIGS. 13A and 13B, respectively, after the insulating layer has been deposited and/or etched such that a predetermined depth remains according to some embodiments. In the embodiments shown, an overburden of the insulating layer 1301 is deposited as shown in FIGS. 13A and 13B and then removed to be coplanar with the second insulating layer 1001, as shown in FIGS. 14A and 14B, then redeposited to a predetermined depth, as shown in FIGS. 15A and 15B. In some embodiments, the insulating layer is deposited as shown in FIGS. 13A and 13B, and then removed to leave a predetermined depth as shown in FIGS. 15A and 15B. In some embodiments, the overburden can be removed by a chemical-mechanical planarization (CMP) process known to those skilled in the art.

In some embodiments, the insulating layer 1301 is deposited such that it is coplanar with the insulating layer 1001, as shown in FIGS. 14A and 14B, and then a predetermined depth of insulating layer 1301 is deposited again to establish a predetermined depth of insulating layer 1301, as shown in FIGS. 15A and 15B. Regardless of the specific method, a predetermined depth of insulating layer 1301 remains as shown in FIGS. 15A and 15B.

Figures 16A, 16B:
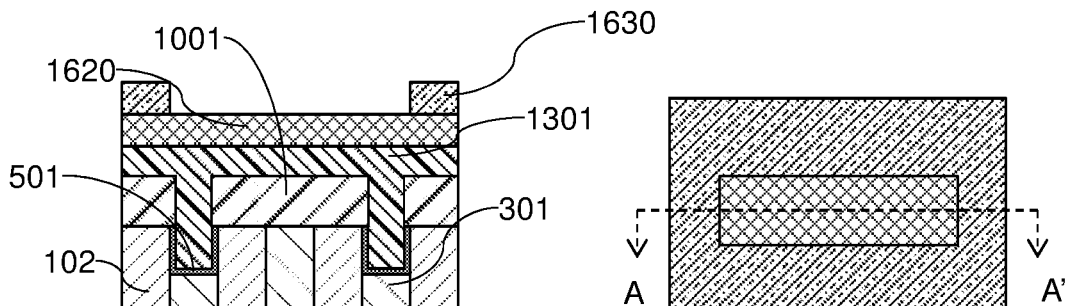
FIG. 16A is a side cross-sectional view of the electronic device structure after masking according to some embodiments.
FIG. 16B is a top view of the electronic device structure shown in FIG. 16A.

FIGS. 16A and 16B are views similar to FIGS. 15A and 15B, respectively, after a first mask 1620 and a second mask 1630 have been deposited on the insulating layer 1301 according to some embodiments. The first mask 1620 and the second mask 1630 may be the same or different than the first mask 201 and the second mask 202 disclosed elsewhere herein.

A first mask 1620 and a second mask 1630 are illustrated on the insulating layer 1301. The first mask 1620 is shown covering the all of the insulating layer 1301 and the second mask 1630 covers the area outside the area of the pillars 901 and the gap 904 as shown in FIGS. 9A and 9B. The first mask 1620 and the second mask 1630 may be the same or different than the first mask 201 and the second mask 202 disclosed elsewhere herein. Those skilled in the art will recognize that the masking and insulator layers can be single or multiple layers.

The thickness of the insulating layer 1301 above the insulating layer 1001 (i.e. the depth of insulating layer 1301 not within the gap 1201) and the first mask 1620 is substantially the same.

Figures 17A, 17B:
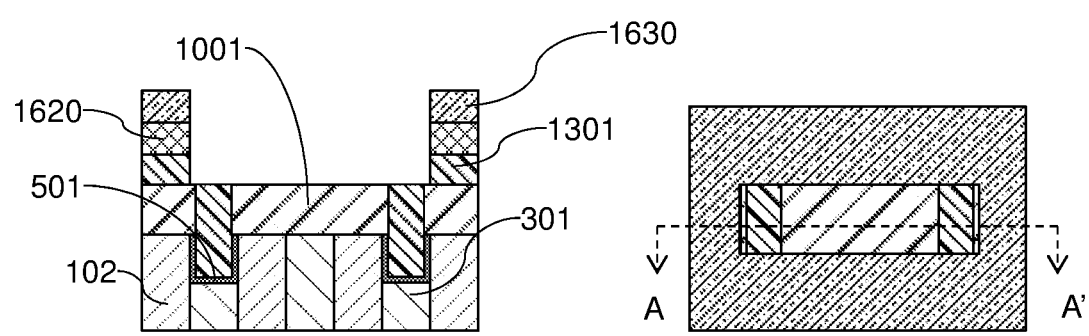
FIG. 17A is a side cross-sectional view of the electronic device structure after etching the third insulating layer to a known depth according to some embodiments.
FIG. 17B is a top view of the electronic device structure shown in FIG. 17A.

FIGS. 17A and 17B are views similar to FIGS. 16A and 16B, respectively, after an etch process isotropically removes a portion of the insulating layer 1301 that is not directly below mask 1630 according to some embodiments. After the isotropic removal, a portion of the insulating layer 1301 and portion of the insulating layer 1001 are exposed.

The insulating layer 1301, mask 1620 and mask 1630 can be removed by any suitable technique or combination of techniques. For example an etch process could selectively remove the insulating layer 1301, mask 1620 and mask 1630 without affecting insulating layer 1001. In some embodiments, more than one etch process is used to remove the insulating layer 1301, mask 1620 and mask 1630. For example, a first etch process can be used to remove mask 1630 and a second etch process can be used to remove mask 1620 and insulating layer 1301. In some embodiments, there are three etch processes used to remove the three layers with each etch process selective for one of the layers.

Figures 18A, 18B:
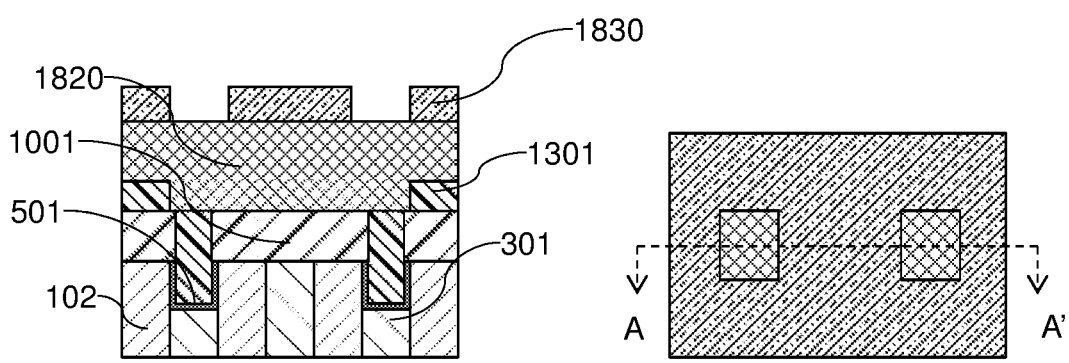
FIG. 18A is a side cross-sectional view of the electronic device structure after forming a stack and masking according to some embodiments.
FIG. 18B is a top view of the electronic device structure shown in FIG. 18A.

FIGS. 18A and 18B are views similar to FIGS. 17A and 17B, respectively, after the previous first mask 1620 and second mask 1630 are removed and a first mask 1820 and a second mask 1830 have been deposited on the insulating layer 1301 and the insulating layer 1001 according to some embodiments. The first mask 1820 and the second mask 1830 may be the same or different than the first mask 201 and the second mask 202 and/or the first mask 1620 and the second mask 1630 disclosed elsewhere herein. Those skilled in the art will recognize that the masking and insulator layers can be single or multiple layers.

A first mask 1820 and a second mask 1830 are illustrated on the insulating layer 1301 and the insulating layer 1001. The first mask 1820 is shown covering all of the insulating layer 1201 and the insulating layer 901. The second mask 1830 is shown covering a similar area to the mask 202 shown in FIGS. 2A and 2B. Those skilled in the art will recognize that the masking and insulator layers can be single or multiple layers. The thickness of the additional first mask 1830 and the insulating layer 1301 within the gap 1201 is substantially the same.

Figures 19A, 19B:
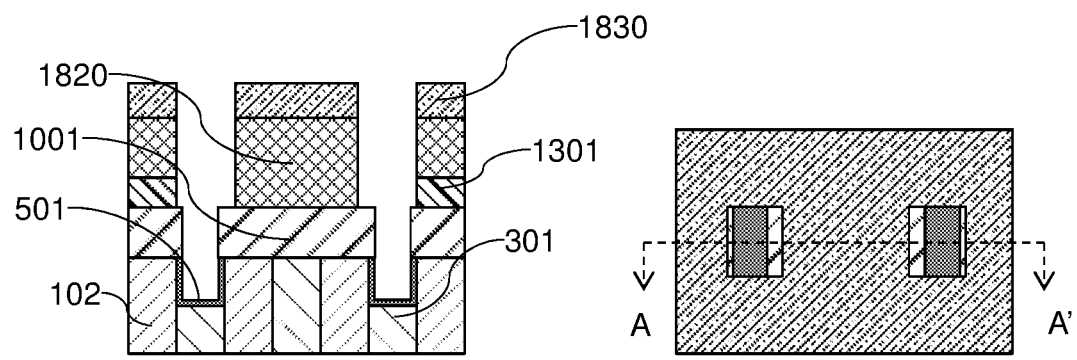
FIG. 19A is a side cross-sectional view of the electronic device structure after etching the third insulating layer to form vias according to some embodiments.
FIG. 19B is a top view of the electronic device structure shown in FIG. 19A.

FIGS. 19A and 19B are views similar to FIGS. 18A and 18B, respectively, after an etch process isotropically removes the insulating material 1301 that is not directly below mask 1830 according to some embodiments.

Figures 20A, 20B:
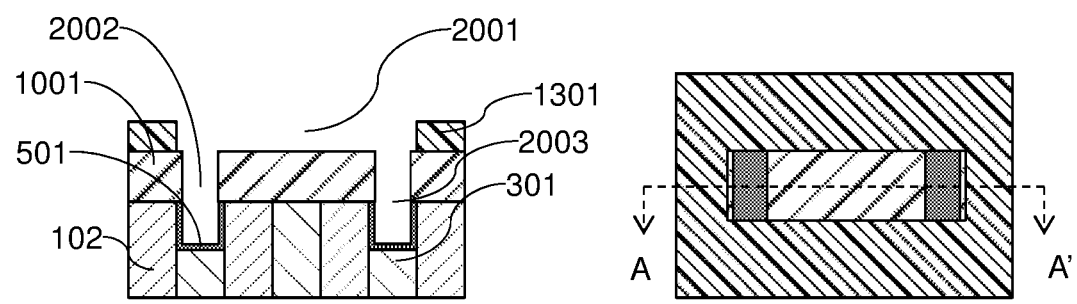
FIG. 20A is a side cross-sectional view of the electronic device structure after a mask layer is removed according to some embodiments.
FIG. 20B is a top view of the electronic device structure of FIG. 20A.

FIGS. 20A and 20B are views similar to FIGS. 19A and 19B, respectively, after mask 1620 and mask 1630 are removed according to some embodiments. After the removal of the mask layers, a portion of the insulating layer 1301, a portion of the insulating layer 1001 and portion of the liner 501 are exposed.

The insulating layer 1301, mask 1820 and mask 1830 can be removed by any suitable technique or combination of techniques. For example an etch process could selectively remove the insulating layer 1301, mask 1820 and mask 1830 without affecting insulating layer 1001. In some embodiments, more than one etch process is used to remove the insulating layer 1301, mask 1820 and mask 1830. For example, a first etch process can be used to remove mask 1830 and a second etch process can be used to remove mask 1820 and insulating layer 1301. In some embodiments, there are three etch processes used to remove the three layers with each etch process selective for one of the layers. Regardless of the number of etch processes, removal of the insulating layer 1301 and the mask 1820 creates a trench 2001 and vias 2002, 2003.

Trench 2001 extends in a second direction that is different from the first direction of the first conductive lines 103. In the embodiment shown, the first conductive lines 103 extend along the x-axis and the trench 2001 extends along the y-axis. In some embodiments, the second direction is at an angle to the first direction in the range of about 30° to about 150°, or in the range of about 50° to about 130°, or in the range of about 70° to about 110°, or in the range of about 80° to about 100°, or in the range of about 85° to about 95°, or in the range of about 87° to about 93°, or in the range of about 89° to about 91°.

Figures 21A, 21B:
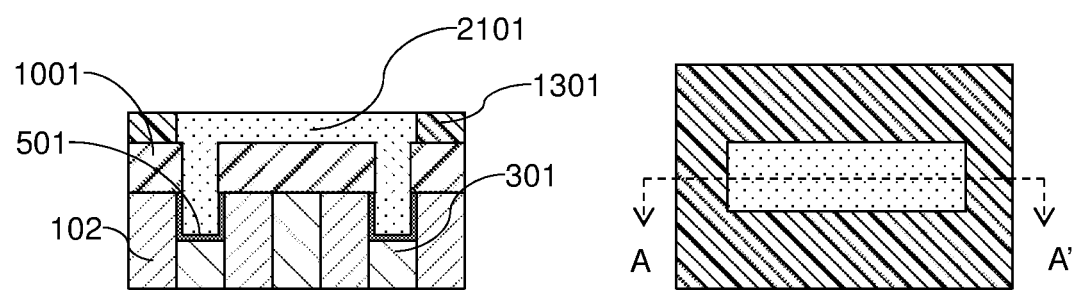
FIG. 21A is a side cross-sectional view of the electronic device structure after forming second conductive lines and filling the vias according to some embodiments.
FIG. 21B is a top view of the electronic device structure shown in FIG. 21A.

FIGS. 21A and 21B are views similar to FIGS. 20A and 20B, respectively, after after deposition of second conductive material to form a second conductive line 2101 in the vias 2002, 2003 and trench 2001 according to some embodiments. The second conductive line 2101 can be any suitable metal and can be deposited by any suitable deposition technique. The second conductive line 2101 extends in the second direction which is different than the first direction of the first conductive line 103, as described herein.

Figure 22:
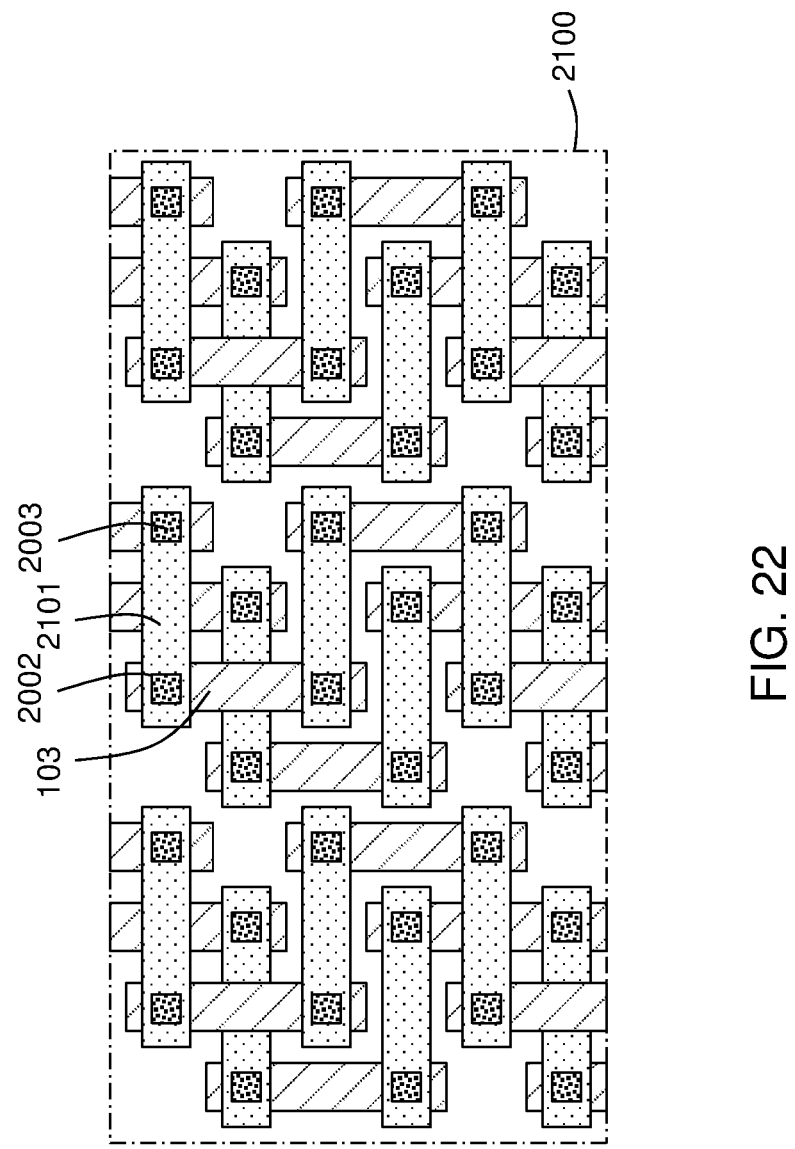
FIG. 22 shows a portion of an electronic device with fully self-aligned vias in accordance with one or more embodiment of the disclosure.

FIG. 22 shows a portion of a device 2100 with the fully self-aligned vias in a nested structure. The first conductive lines 103 extend vertically in the diagram and the second conductive lines 2101 extend horizontally on the page. Vias 2002, 2003 are illustrated where the connections between the first conductive lines 103 and the second conductive lines 2101 occur. The packing and arrangement of the conductive lines and vias can be tighter (i.e., higher density) or looser (i.e., lower density) than the embodiment illustrated.

Figure 23:
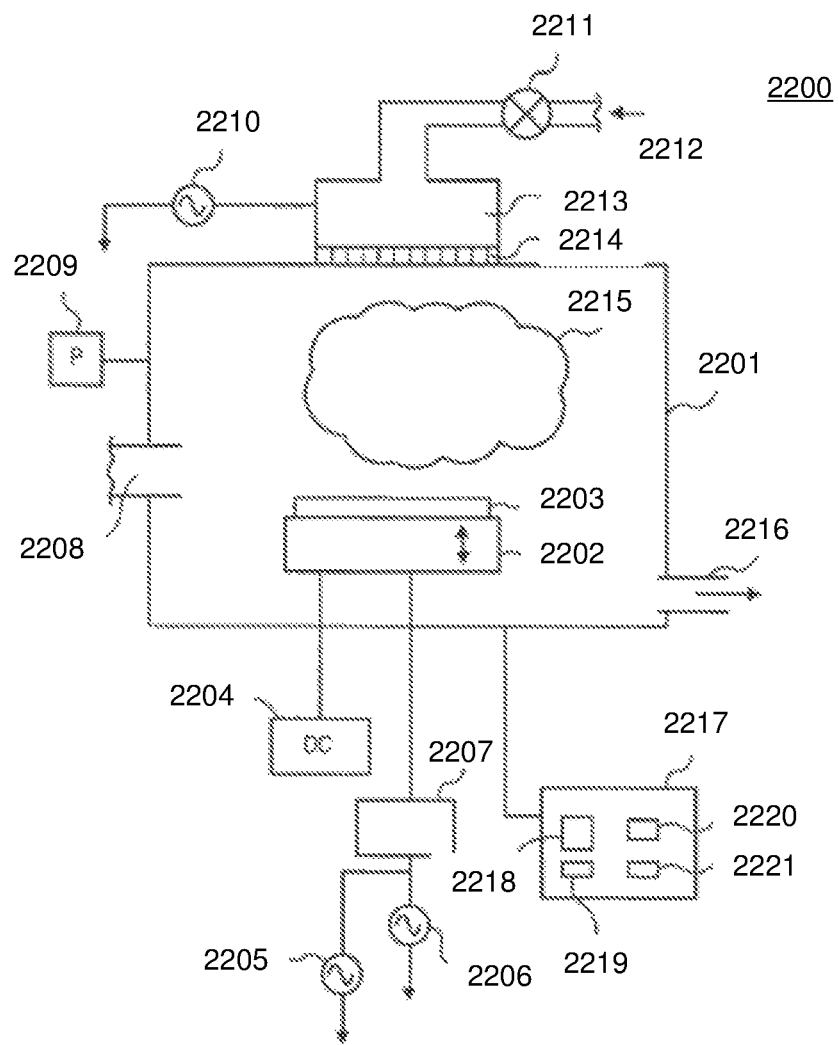
FIG. 23 shows a block diagram of a plasma system in accordance with one or more embodiment of the disclosure.

FIG. 23 shows a block diagram of a plasma system to perform at least some of the operations to provide a fully self-aligned via according to one embodiment. As shown in FIG. 23, system 2200 has a processing chamber 2201. A movable pedestal 2202 to hold an electronic device structure 2203 is placed in processing chamber 2201. Pedestal 2202 comprises an electrostatic chuck ("ESC"), a DC electrode embedded into the ESC, and a cooling/heating base. In an embodiment, pedestal 2202 acts as a moving cathode. In an embodiment, the ESC comprises an $Al_2O_3$ material, $Y_2O_3$, or other ceramic materials known to one of ordinary skill of electronic device manufacturing. A DC power supply 2204 is connected to the DC electrode of the pedestal 2202.

As shown in FIG. 23, an electronic device structure 2203 is loaded through an opening 2208 and placed on the pedestal 2202. The electronic device structure 2203 represents one of the electronic device structures described above. System 2200 comprises an inlet to input one or more process gases 2212 through a mass flow controller 2211 to a plasma source 2213. A plasma source 2213 comprising a showerhead 2214 is coupled to the processing chamber 2201 to receive one or more gases 2212 to generate plasma. Plasma source 2213 is coupled to a RF source power 2210. Plasma source 2213 through showerhead 2214 generates a plasma 2215 in processing chamber 2201 from one or more process gases 2212 using a high frequency electric field. Plasma 2215 comprises plasma particles, such as ions, electrons, radicals or any combination thereof. In an embodiment, power source 2210 supplies power from about 50 W to about 3000 W at a frequency from about 400 kHz to about 162 MHz to generate plasma 2215.

A plasma bias power 2205 is coupled to the pedestal 2202 (e.g., cathode) via a RF match 2207 to energize the plasma. In an embodiment. the plasma bias power 2205 provides a bias power that is not greater than 1000 W at a frequency between about 2 MHz to 60 MHz. and in a particular embodiment at about 13 MHz. A plasma bias power 2206 may also be provided. for example to provide another bias power that is not greater than 1000 W at a frequency from about 400 kHz to about 60 MHz, and in a particular embodiment, at about 60 MHz. Plasma bias power 2206 and bias power 2205 are connected to RF match 2207 to provide a dual frequency bias power. In an embodiment. a total bias power applied to the pedestal 2202 is from about 10 W to about 3000 W.

As shown in FIG. 23, a pressure control system 2209 provides a pressure to processing chamber 2201. As shown in FIG. 20, chamber 2201 has one or more exhaust outlets 2216 to evacuate volatile products produced during processing in the chamber. In an embodiment, the plasma system 2200 is an inductively coupled plasma (ICP) system. In an embodiment, the plasma system 2200 is a capacitively coupled plasma (CCP) system.

A control system 2217 is coupled to the chamber 2201. The control system 2217 comprises a processor 2218, a temperature controller 2219 coupled to the processor 2218, a memory 2220 coupled to the processor 2218 and input/output devices 2221 coupled to the processor 2218 to form fully self-aligned via as described herein. The control system 2217 can also include one or more of circuits, non-transitory memory, transitory memory, electronic media or executable instruction sets as may be used to operate under various configurations.

In one embodiment, the control system 2217, or the processor 2218 within the control system 2217 includes one or more configurations (i.e., executable instruction sets) to process a substrate. The control system 2217 and/or processor 2218 may have one or more configurations to control actions or processes selected from: recessing the first conductive lines, forming a first metal film on the recessed first conductive lines and the first insulating material, forming pillars and a sheet from the first metal film in the recessed first conductive lines and on the first insulating material, selectively removing a portion of the sheet and the pillars and leaving at least one portion of the sheet supported by two pillars, depositing a second insulating layer around the remaining pillars and sheet, removing the remaining pillars and sheet to form vias in the second insulating layer, depositing a third insulating layer through the vias onto the recessed first conductive lines to form filled vias, forming an overburden of third insulating layer on the second insulating layer, selectively etching a portion of the overburden from the second insulating layer to expose the second insulating layer and the filled vias and leaving portions of third insulating layer on the second insulating layer, and/or etching the third insulating layer from the filled vias to form a via opening to the first conductive line. In some embodiments, the configuration controls recessing the first conductive lines such that the first conductive lines are recessed in the range of about 10 nm to about 50 nm. In some embodiments, the control system 2217 and/or processor 2218 includes a configuration to deposit a liner on the recessed first conductive lines. In some embodiments, the control system 2217 and/or processor 2218 includes a configuration deposit a second conductive material into the via opening. In some embodiments, the control system 2217 and/or processor 2218 includes a configuration to deposit a plurality of second conductive lines on the second insulating layer and in contact with the second conductive material in the via opening, the second conductive lines extending along a second direction on the second insulating layer.

The control system 2217 is configured to perform at least some of the methods as described herein and may be either software or hardware or a combination of both. The plasma system 2200 may be any type of high performance processing plasma systems known in the art, such as but not limited to an etcher, a cleaner, a furnace, or any other plasma system to manufacture electronic devices.

The control system 2217 can be any suitable controller and may include a processor 2218 coupled with a memory 2220 configured to enable the processing of one or more electronic device structures. For example, the processor 2218 may be configured with executable instructions stored in the memory 2220 to enable operations of pedestal 2202, the mass flow controller 2211, the plasma source 2213 and/or the pressure control system 2209 as described herein.

In one or more embodiments, the processor 2218 may be one of any form of general-purpose computer processors that can be used in an industrial setting for controlling various manufacturing equipment used in semiconductor manufacturing. The memory 2220 may be in the form of a computer-readable medium and may be one or more of readily available memory such as random access memory (RAM), read only memory (ROM), floppy disk, hard disk, or any other form of digital storage, local or remote. In one or more embodiments, support circuits (not shown) are coupled to the processor 2218 for supporting the processor 2218 in a conventional manner. These support circuits can include cache, power supplies, clock circuits, input/output circuitry and subsystems, and the like.

In one or more embodiments, process routines may generally be stored in the memory 2220 as a software routine that, when executed by the processor 2218, causes the processing platform 2200 to perform processes disclosed herein. The software routine may also be stored and/or executed by a second processor (not shown) that is remotely located from the hardware being controlled by the processor 2218. The software routine, when executed by the processor 2218 causes the control system 2217 to function as a specific purpose controller. When the control system 2217 includes a computer, the control system 2217 functions as a special purpose computer for controlling the processing platform 2200 to perform the processes disclosed herein.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method to provide a self-aligned via, the method comprising:
    recessing a portion of first conductive lines on a plurality of first insulating layers on a substrate, the first conductive lines extending along a first direction on the first insulating layer;
    depositing a liner on the recessed portions of the first conductive lines;
    forming a first metal film on the liner in the recessed portions of the first conductive lines;
    forming pillars from a first metal film on the liner in the recessed portions of the first conductive lines;
    depositing a second insulating layer around the pillars;
    removing the pillars to form vias in the second insulating layer;
    depositing a third insulating layer in the vias onto the recessed portion of the first conductive lines to form filled vias;
    forming an overburden of third insulating layer on the second insulating layer;
    selectively etching a portion of the overburden from the second insulating layer to expose the second insulating layer and the filled vias and leaving portions of third insulating layer on the second insulating layer; and
    etching the third insulating layer from the filled vias to form a via opening to the first conductive line.

2. The method of claim 1, wherein the first conductive lines are between the plurality of first insulating layers.

3. The method of claim 1, wherein the pillars are formed from the first metal film by forming the first metal film on the liner in the recessed portions of the first conductive lines, and oxidizing the first metal film to form pillars.

4. The method of claim 1, wherein the liner is deposited conformally on the first insulating layer and the recessed portions of the first conductive lines and the liner is removed from the first insulating layer by planarization or chemical etch.

5. The method of claim 1, wherein a liner is deposited selectively on only the recessed portions of the first conductive lines.

6. The method of claim 1, wherein the liner comprises a conductive material.

7. The method of claim 6, wherein the conductive material is selected from TiN, TaN, TiN/TaN or combinations thereof.

8. The method of claim 1, wherein the liner comprises a nonconductive material.

9. The method of claim 8, wherein the nonconductive material is selected from SiN, AlN, or combinations thereof.

10. The method of claim 8, further comprising removing the liner after either the pillars are removed or the third insulating layer is etched from the filled vias.

11. The method of claim 1, wherein the first metal film comprises tungsten and wherein the pillars are formed by oxidizing the first metal film to form tungsten oxide.

12. The method of claim 1, wherein the sheet and pillars are removed by a exposure to a metal halide or wet etching with a solution of HF and $HNO_3$ or a solution of $NH_4OH$ and $H_2O_2$.

13. The method of claim 1, further comprising depositing a second conductive material into the via opening.

14. The method of claim 13, further comprising depositing a second conductive line on the second insulating layer and in contact with the second conductive material in the via opening, the second conductive line extending along a second direction on the second insulating layer.

15. The method of claim 14, wherein the second direction crosses the first direction at an angle in the range of about 30° to about 150°.

16. A method to provide an electronic device with a self-aligned via, the method comprising:
  recessing a portion of first conductive lines on a first insulating layer on a substrate, the first conductive lines extending along a first direction on the first insulating layer;
  selectively depositing a liner, comprising TiN, on the recessed portions of the first conductive lines;
  forming a first metal film, comprising tungsten, on the liner in the recessed portions of the first conductive lines;
  oxidizing the first metal film to form pillars of tungsten oxide in the recessed portions of the first conductive lines;
  depositing a second insulating layer around the pillars;
  removing the pillars to form vias in the second insulating layer;
  depositing a third insulating layer in the vias onto the recessed portions of the first conductive lines to form filled vias;
  forming an overburden of third insulating layer on the second insulating layer;
  selectively etching a portion of the overburden from the second insulating layer to expose the second insulating layer and the filled vias and leaving portions of third insulating layer on the second insulating layer;
  etching the third insulating layer from the filled vias to form a via opening to the first conductive line;
  depositing a second conductive material into the via opening; and
  depositing a second conductive line on the second insulating layer and in contact with the second conductive material in the via opening, the second conductive lines extending along a second direction on the second insulating layer,
  wherein the second direction crosses the first direction at an angle in the range of about 30° to about 150°.

* * * * *